US012674826B2

(12) United States Patent
Wen et al.

(10) Patent No.: US 12,674,826 B2
(45) Date of Patent: Jul. 7, 2026

(54) QUANTIFIABLE ELECTROMAGNETIC RELAY AND ELECTRONIC ENERGY METER

(71) Applicant: Xiamen Hongfa Electric Power Controls Co., Ltd., Xiamen (CN)

(72) Inventors: Zhigang Wen, Xiamen (CN); Shuming Zhong, Xiamen (CN); Wenguang Dai, Xiamen (CN); Fangneng Li, Xiamen (CN)

(73) Assignee: XIAMEN HONGFA ELECTRIC POWER CONTROLS CO., LTD., Xiamen (CN)

( * ) Notice: Subject to any disclaimer, the term of this patent is extended or adjusted under 35 U.S.C. 154(b) by 111 days.

(21) Appl. No.: 18/725,543

(22) PCT Filed: Dec. 28, 2022

(86) PCT No.: PCT/CN2022/142674
§ 371 (c)(1),
(2) Date: Jun. 28, 2024

(87) PCT Pub. No.: WO2023/125625
PCT Pub. Date: Jul. 6, 2023

(65) Prior Publication Data
US 2025/0123311 A1      Apr. 17, 2025

(30) Foreign Application Priority Data

Dec. 30, 2021    (CN) ......................... 202111659685.7
Dec. 30, 2021    (CN) ......................... 202123430937.7

(51) Int. Cl.
*G01R 22/06*      (2006.01)
*H01H 50/02*      (2006.01)
(Continued)

(52) U.S. Cl.
CPC ......... *G01R 22/061* (2013.01); *H01H 50/021* (2013.01); *H01H 50/14* (2013.01); *H01H 50/44* (2013.01); *H01H 50/54* (2013.01)

(58) Field of Classification Search
CPC ...... G01R 22/00; G01R 22/06; G01R 22/061; G01R 22/065; H01C 1/00; H01C 1/14;
(Continued)

(56) References Cited

U.S. PATENT DOCUMENTS

2009/0177421 A1      7/2009   Kurokawa

FOREIGN PATENT DOCUMENTS

CN          203456390 U       2/2014
CN          103630716 A       3/2014
(Continued)

OTHER PUBLICATIONS

Japanese Patent Office Notice of Allowance; JP Application No. 2024-539425; Mailed Jul. 22, 2025; 5 pages.
(Continued)

*Primary Examiner* — Hoai-An D. Nguyen
(74) *Attorney, Agent, or Firm* — CANTOR COLBURN LLP

(57) ABSTRACT

A quantifiable electromagnetic relay includes a housing, a PCB board, and two leading-out pieces extending from an inside to a first side of the housing and connected to a contact assembly inside the housing; one leading-out piece includes a plate-like sampling resistor piece made of high resistivity materials and conductive pieces connected at two ends of the sampling resistor piece, two sampling pins extending in the same direction are arranged at the two ends of the sampling resistor piece; the PCB board is connected to two sampling pins; a through-hole is provided in the sampling resistor piece. An induced current generated by a first closed loop formed by the through-hole offsets an induced current
(Continued)

generated by a second closed loop formed by the sampling resistor piece, the sampling pins, and the PCB board in the external alternating magnetic field, thereby enhancing the relay's ability to resist interference.

30 Claims, 17 Drawing Sheets

(51) Int. Cl.
*H01H 50/14* (2006.01)
*H01H 50/44* (2006.01)
*H01H 50/54* (2006.01)

(58) Field of Classification Search
CPC ...... H01H 50/00; H01H 50/02; H01H 50/021; H01H 50/12; H01H 50/14; H01H 50/44; H01H 50/54; H01H 85/00; H01H 85/02; H01H 85/0241; H01H 85/0266
USPC ........................................................ 324/76.11
See application file for complete search history.

(56) References Cited

FOREIGN PATENT DOCUMENTS

| CN | 203502490 | U | | 3/2014 | | |
|----|-----------|---|---|--------|---|---|
| CN | 105353184 | A | | 2/2016 | | |
| CN | 205049627 | U | * | 2/2016 | ............. | G01R 11/04 |
| CN | 205210141 | U | | 5/2016 | | |
| CN | 109324307 | A | | 2/2019 | | |
| CN | 109696580 | A | | 4/2019 | | |
| CN | 110702956 | A | | 1/2020 | | |
| CN | 209993552 | U | * | 1/2020 | ............. | H01H 50/04 |
| CN | 212540483 | U | | 2/2021 | | |
| CN | 212568941 | U | * | 2/2021 | ............. | G01R 22/06 |
| CN | 112462114 | A | | 3/2021 | | |
| CN | 112630483 | A | | 4/2021 | | |
| CN | 114360963 | A | | 4/2022 | | |
| CN | 216900660 | U | | 7/2022 | | |
| CN | 217426640 | U | | 9/2022 | | |
| CN | 112730928 | B | * | 5/2023 | ............. | G01R 11/06 |
| CN | 114137858 | B | * | 3/2025 | ............. | G08C 17/02 |
| EP | 2924448 | A1 | | 9/2015 | | |
| EP | 2924448 | B1 | | 11/2019 | | |
| FR | 2884615 | A1 | | 10/2006 | | |
| JP | 3166989 | U | | 3/2011 | | |

OTHER PUBLICATIONS

International Search Report in International Application No. PCT/CN2022/142674, mailed Mar. 24, 2023; 6 pages.
Extended EP Search Report for PCT/CN2022142674; dtd Nov. 19, 2025; 9 Pages.
Indian Office Action for CN2022142674; dtd Apr. 24, 2026; 8 pages.

* cited by examiner

QUANTIFIABLE ELECTROMAGNETIC RELAY AND ELECTRONIC ENERGY METER

CROSS-REFERENCE TO RELATED APPLICATIONS

The present disclosure is a national stage of International PCT Application No. PCT/CN2022/142674, filed on Dec. 28, 2022, which claims priority to Chinese Patent Applications No. 202111659685.7 and No. 202123430937.7 filed on Dec. 30, 2021, the disclosure of which are hereby incorporated by reference in its entirety.

TECHNICAL FIELD

The present disclosure relates to the technical field of electronic meters, particularly to a quantifiable electromagnetic relay and an electronic energy meter thereof.

BACKGROUND

The electronic energy meter is an electronic metering device that samples a user's supply voltage and current in real-time. It utilizes a specialized energy meter integrated circuit to process sampled voltage and current signals and convert them into pulse outputs that are proportional to electrical energy, and then displayed by a meter or a digital display. In the electronic energy meter, a relay is typically used to control a load circuit. As an electronic control device, the relay includes a control system (also referred to as an input circuit) and a controlled system (also referred to as an output circuit), which are commonly applied in an automatic control circuit and essentially serve as an "automatic switch" that uses a small current to control a large current, performing functions such as automatic regulation, safety protection, and circuit conversion within the circuit. The existing quantifiable electromagnetic relay for the electronic energy meter generally includes a housing, contact assembly inside the housing, and two leading-out pieces connected to the contact assembly inside the housing. One of the leading-out pieces features a manganese-copper piece as a metering device, with sampling pins on the manganese-copper piece connected to a PCB board via signal wires. This type of relay has several drawbacks: on the one hand, the connection using the signal wires requires welding processes, leading to complex procedures, high manufacturing costs, and low automation levels; on the other hand, external magnetic field interference can reduce metering accuracy.

Furthermore, the quantifiable electromagnetic relay for the electronic energy meter in the prior art adopts a two-set metering relay that is provided with four leading-out pieces, and every two of the leading-out pieces form one set, and each set is connected to corresponding contact assembly. In this two-set metering relay, one of the leading-out pieces in each set is provided with a metering device, one of the leading-out pieces in one set has a manganese-copper piece as a sampling circuit for metering, and one of the leading-out pieces in the other set is provided with a current transformer as a sampling circuit for metering. There are disadvantages in the two-set metering relay with this metering mode in the prior art: first, the use of a current transformer for metering in one set can increase the cost of the relay, affecting the competitiveness of the product; second, both the manganese-copper piece and the current transformer are connected by using the signal wires, and the leading-out coils are also connected by using the signal wires, resulting in complex production processes, a high likelihood of welding errors, high labor costs, and low automation levels.

SUMMARY

A quantifiable electromagnetic relay includes a housing, a PCB board, and two leading-out pieces extending from an inside of the housing to a first side of the housing and connected to contact assembly inside the housing; one of the two leading-out pieces includes a sampling resistor piece which is plate-like and made of high resistivity materials and conductive pieces respectively connected at two ends of the sampling resistor piece, two sampling pins extending in the same direction being arranged at the two ends of the sampling resistor piece, for realizing inflow and outflow of current; the PCB board is respectively connected to the sampling pins of the two sampling resistor pieces in an insertion welding manner; wherein a through-hole is provided in the sampling resistor piece along a thickness direction of a board body of the sampling resistor piece, such that an induced current generated in an external alternating magnetic field by a first closed loop formed by the through-hole offsets an induced current generated by a second closed loop formed by the sampling resistor piece, the sampling pins, and the PCB board in the external alternating magnetic field, thereby enhancing an ability of the relay to resist interference in measurement of the external alternating magnetic field.

An area of the first closed loop is the same as an area of the second closed loop, and the induced current generated by the first closed loop formed by the through hole in the external alternating magnetic field completely offsets the induced current generated by the second closed loop enclosed by the sampling resistor piece, the sampling pins and the PCB board in the external alternating magnetic field.

There are two leading-out pieces extending from the inside of the housing to the first side out of the housing and connected to the contact assembly inside the housing, and there is one set of contact assembly inside the housing; one of the two leading-out pieces includes the sampling resistor piece.

There are four leading-out pieces extending from the inside of the housing to the first side of the housing and connected to the contact assembly inside the housing are four, and there are two sets of contact assemblies inside the housing; in the four leading-out pieces, every two of the leading-out pieces are connected to one set of corresponding contact assembly; in each set of the leading-out pieces, one of the leading-out pieces comprises the sampling resistor piece.

The PCB board is connected to the sampling pins on the same plane in an insertion welding manner.

The housing is further provided with coil leading-out pins extending from the inside of the housing, and the coil leading-out pins and the sampling pins are respectively connected to the PCB board on the same plane in an insertion welding manner.

The two sampling pins in a same leading-out piece are respectively connected to top surfaces of corresponding sampling resistor pieces.

The two sampling pins in a same leading-out piece are respectively connected to the top surface of corresponding conductive pieces.

The sampling pins of the two leading-out pieces are respectively in a pin structure.

A first projection is further arranged at a connection with the corresponding leading-out piece in the sampling pin, and a cross-section of the first projection is larger than a cross-section of the sampling pin, and the PCB board is placed on a top surface of the first projection.

First projections are further arranged in the sampling pins, at a connection with corresponding leading-out pieces, and a cross-section of each of the first projections is larger than a cross-section of each of the two sampling pins, and the PCB board is placed on a top surface of the first projections.

A solder layer is coated on an outside of a part of an upper surface of the sampling pin corresponding to the first projection.

The through-hole of the sampling resistor piece is on a vertical line at a midpoint of a connection line of the two sampling pins.

The coil leading-out pins are distributed on a top surface of the housing close to a second side of the housing, the second side of the housing is opposite to the first side of the housing, and second projections are respectively arranged at two sides of the top surface of the housing, the second projections close to the second side of the housing, and a top surface of the second projection is at a same height as the top surface of the first projection; the PCB board is placed on the top surface of the first projection and the top surface of the second projection.

There are four leading-out pieces arranged in order along the first side of the housing, in which two leading-out pieces in the middle of the four leading-out pieces are respectively connected to one set of contact assembly inside the housing through one edge of the first side of the housing, and one of the two leading-out pieces on the two sides is connected to another set of the contact assembly inside the housing from another edge of the first side of the housing by going around the bottom of the housing to close to the other one of the leading-out pieces.

The sampling resistor piece is made of a manganese-copper piece or a constantan piece.

An electronic energy meter includes the quantifiable electromagnetic relay as mentioned above.

DETAILED DESCRIPTION

Figure 1:
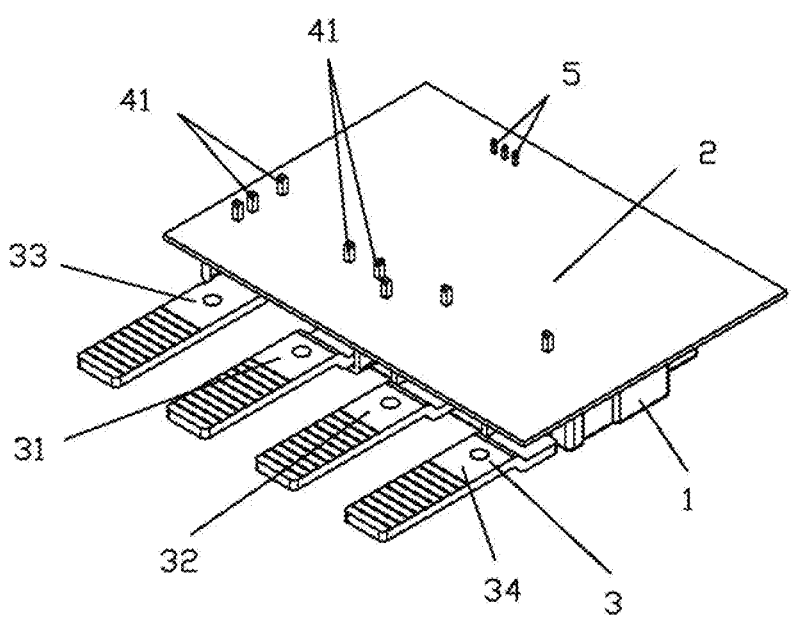
FIG. 1 is a perspective view of a quantifiable electromagnetic relay according to a first embodiment of the present disclosure.
Figure 2:
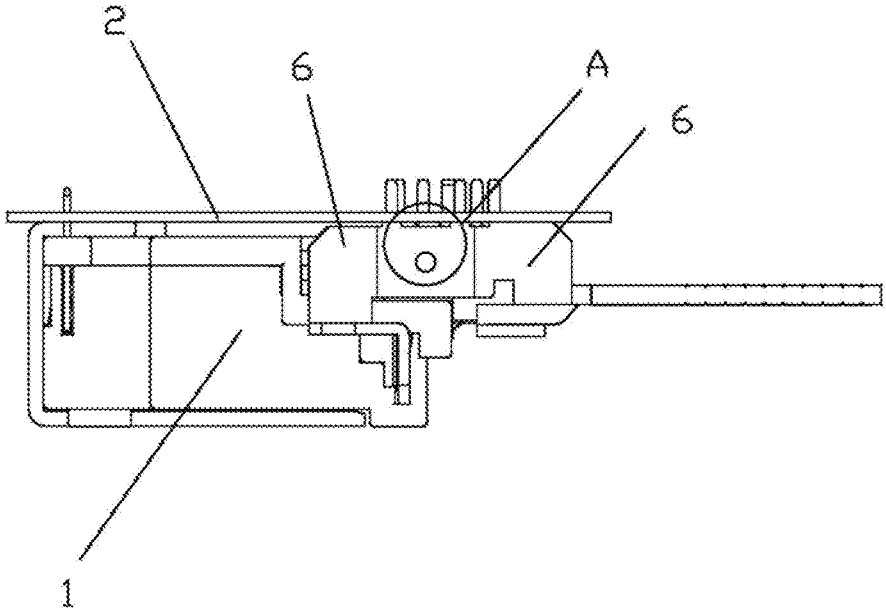
FIG. 2 is a front view of the quantifiable electromagnetic relay according to the first embodiment of the present disclosure.
Figure 3:
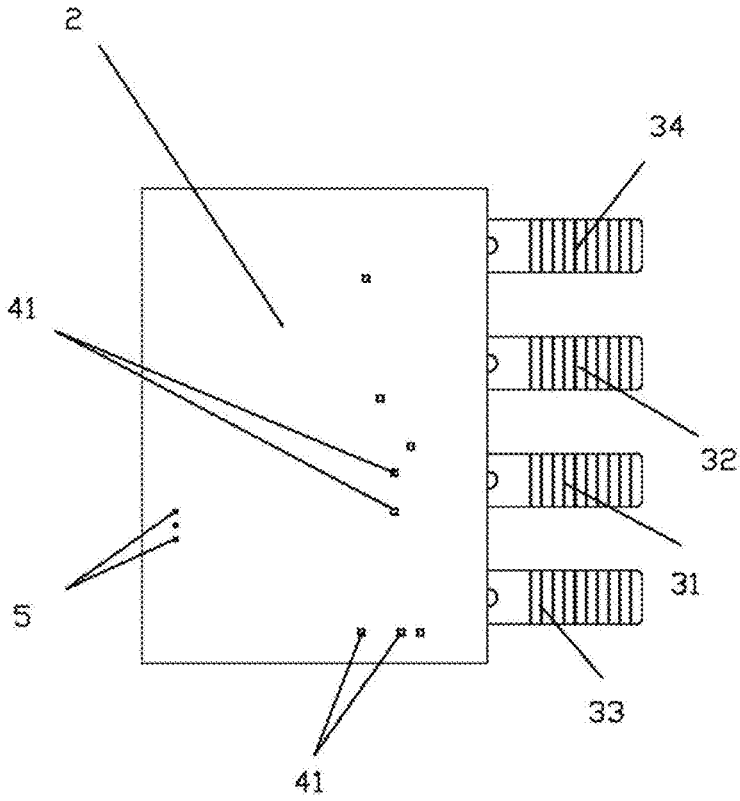
FIG. 3 is a top view of the quantifiable electromagnetic relay according to the first embodiment of the present disclosure.
Figure 4:
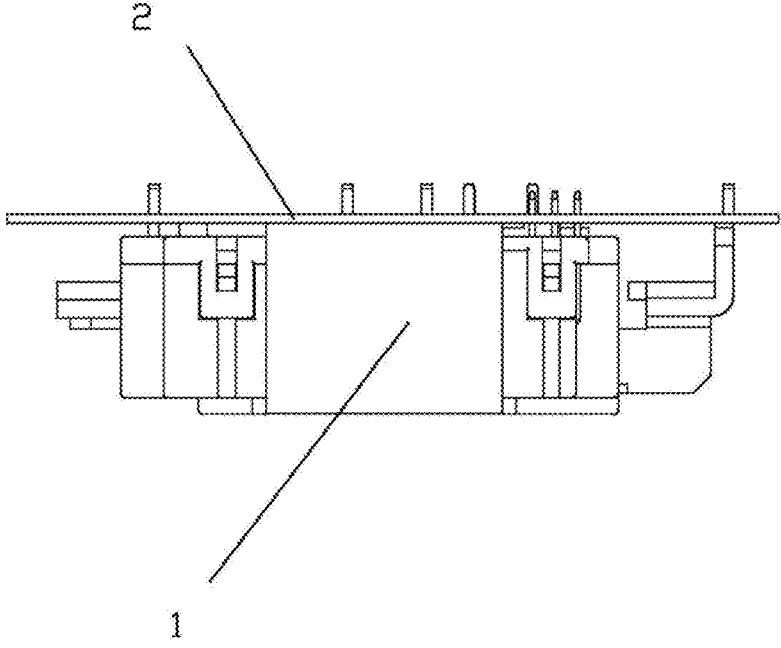
FIG. 4 is a left view of the quantifiable electromagnetic relay according to the first embodiment of the present disclosure.
Figure 5:
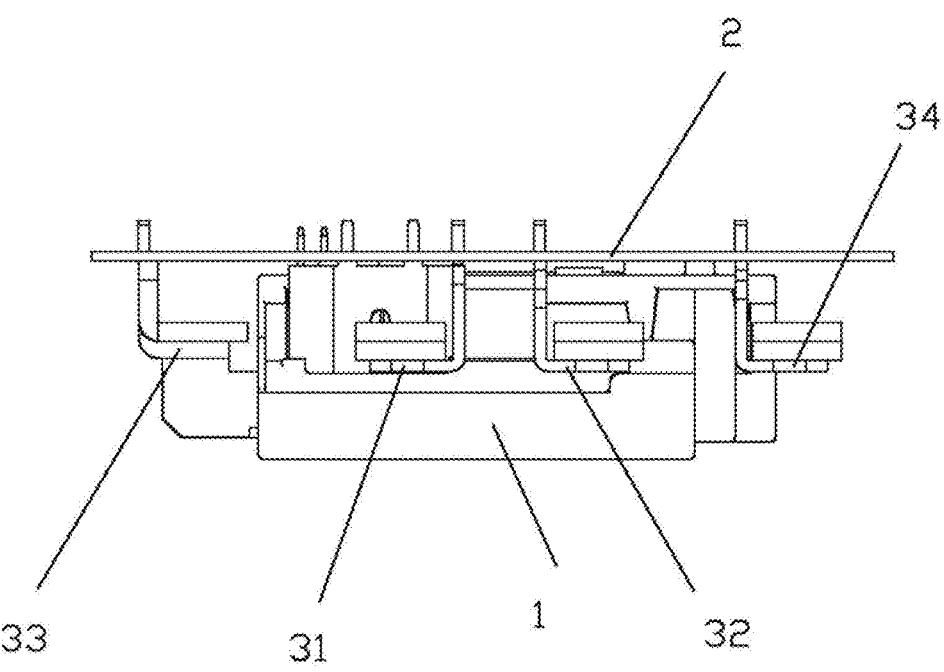
FIG. 5 is a right view of the quantifiable electromagnetic relay according to the first embodiment of the present disclosure.

Exemplary embodiments will now be described more fully by reference to the accompanying drawings. However, the exemplary embodiments can be implemented in various forms and should not be understood as being limited to the examples set forth herein. Although terms having opposite meanings such as "up" and "down" are used herein to describe the relationship of one component relative to another component, such terms are used herein for the sake of convenience, for example, "in the direction illustrated in the figure". It can be understood that if a device denoted in the drawings is turned upside down, a component described as "above" something will become a component described as "under" something. When a structure is described as "above" another structure, it may mean that the structure is integrally formed on another structure, or, the structure is "directly" disposed on another structure; or, the structure is "indirectly" disposed on another structure through an additional structure.

Words such as "one", "an/a", "the" and "said" are used herein to indicate the presence of one or more elements/component parts/and others. Terms "including", and "having" have an inclusive meaning which means that there may be additional elements/component parts/and others in addition to the listed elements/component parts/and others. Terms "first", "second", "third" and "fourth" are used herein as markers, and they do not limit the number of objects modified after them.

The First Embodiment

Figure 6:
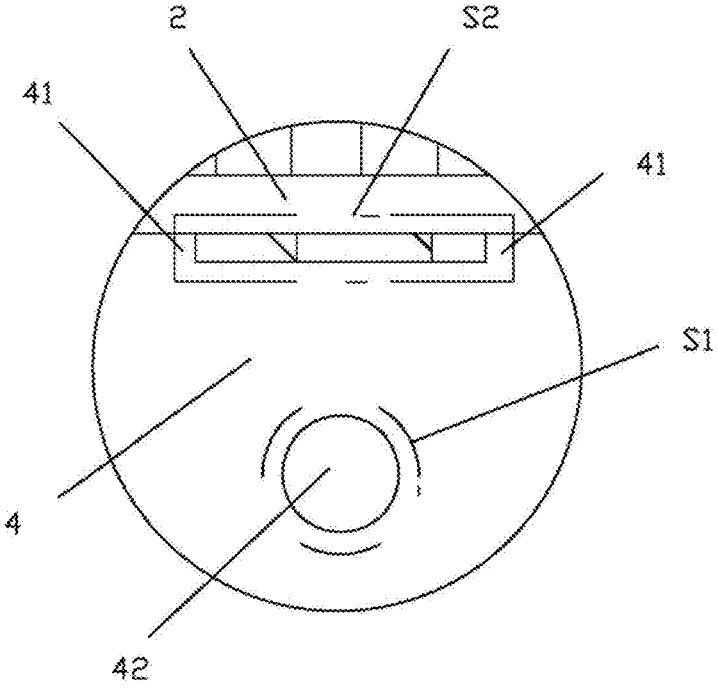
FIG. 6 is an enlarged schematic view of part A in FIG. 2.
Figure 7:
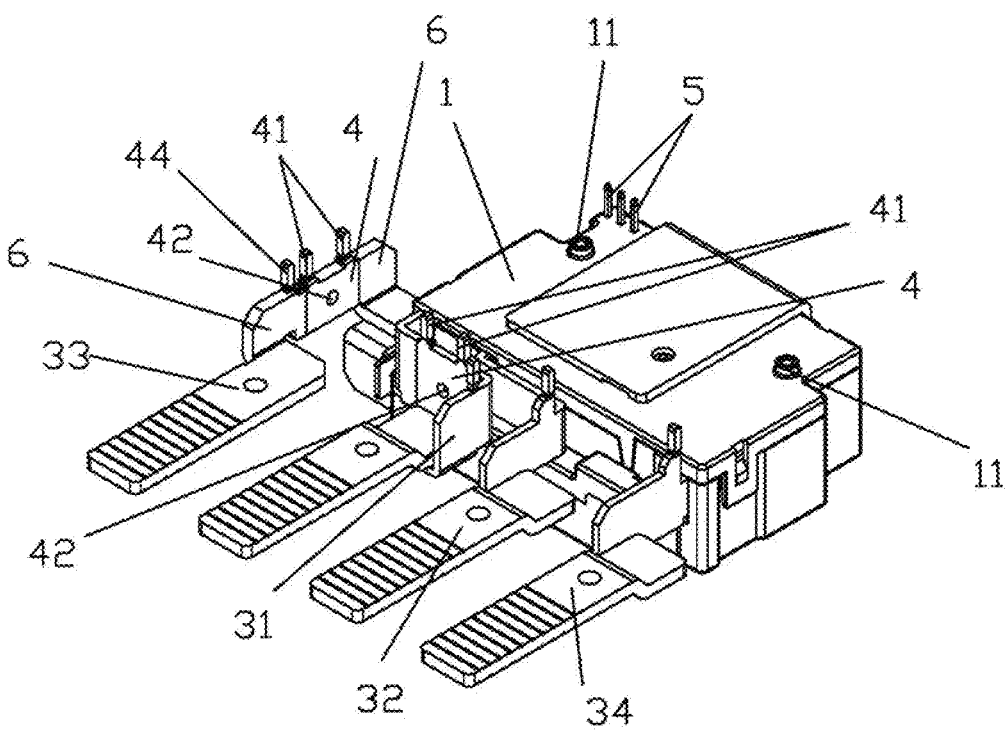
FIG. 7 is a perspective view of the quantifiable electromagnetic relay without a PCB board according to the first embodiment of the present disclosure.
Figure 8:
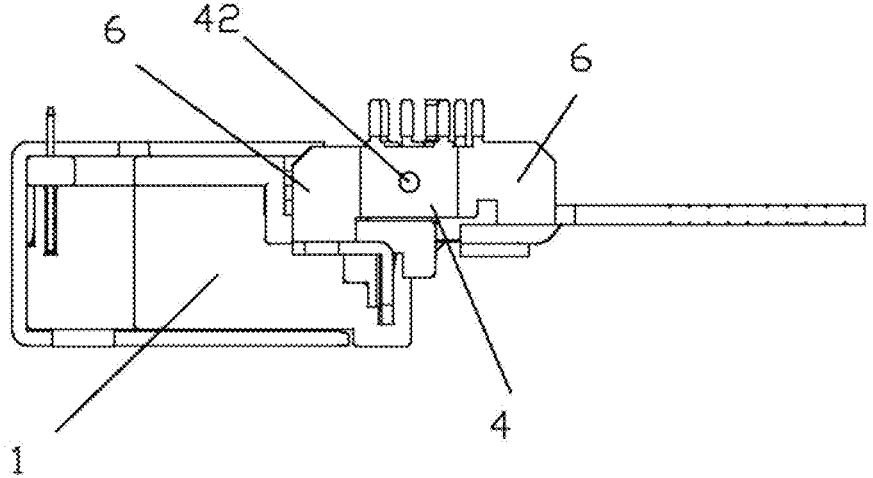
FIG. 8 a front view of the quantifiable electromagnetic relay without the PCB board according to the first embodiment of the present disclosure.
Figure 9:
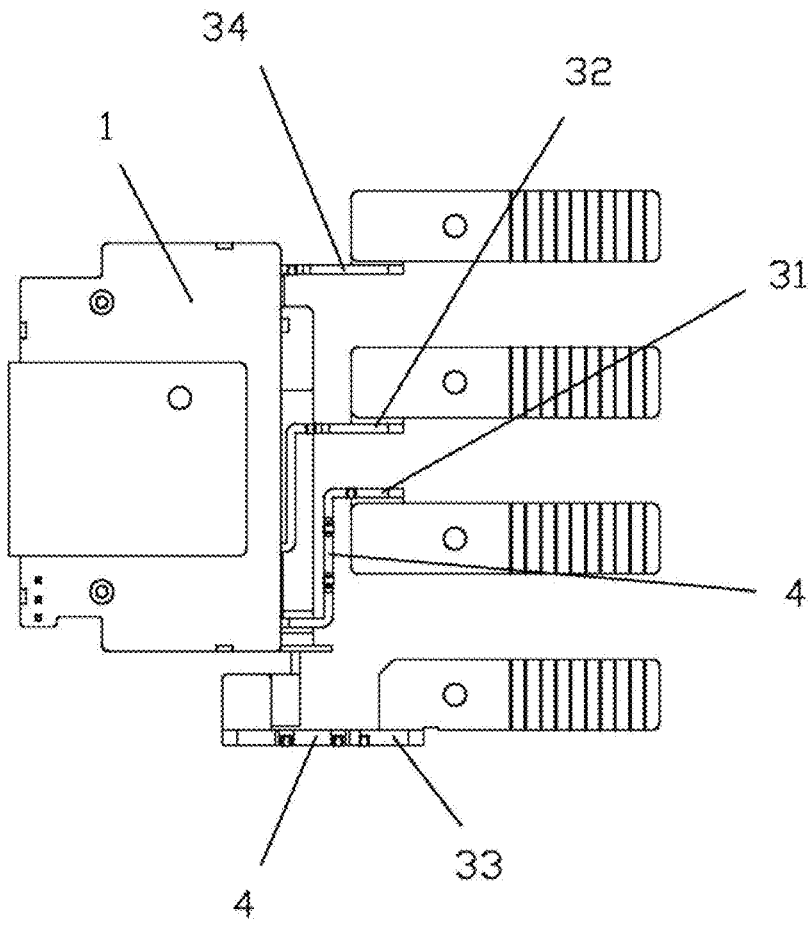
FIG. 9 is a top view of the quantifiable electromagnetic relay without the PCB board according to the first embodiment of the present disclosure.
Figure 10:
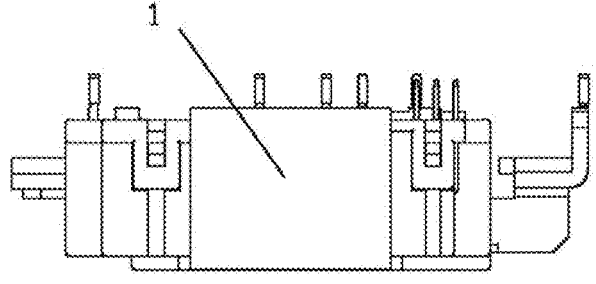
FIG. 10 is a left view of the quantifiable electromagnetic relay without the PCB board according to the first embodiment of the present disclosure.
Figure 11:
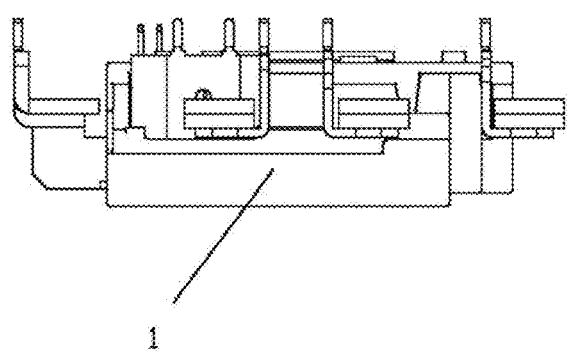
FIG. 11 is a right view of the quantifiable electromagnetic relay without the PCB board according to the first embodiment of the present disclosure.
Figure 12:
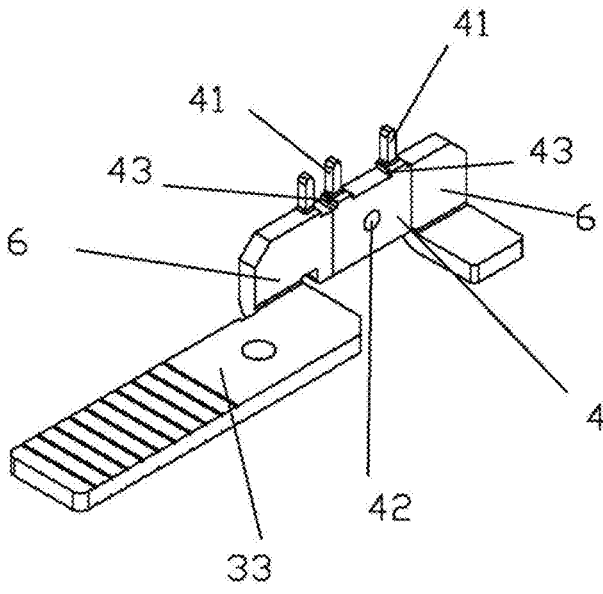
FIG. 12 is a perspective view of one of leading-out pieces of the quantifiable electromagnetic relay according to the first embodiment of the present disclosure.
Figure 13:
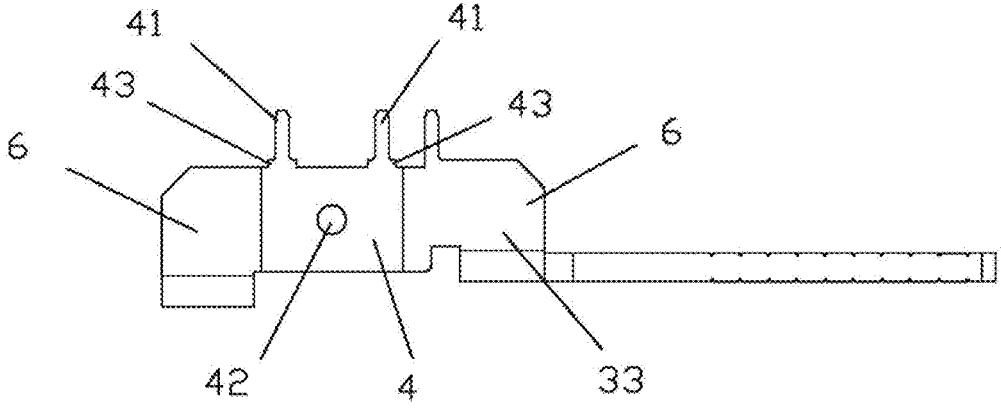
FIG. 13 is a front view of one of the leading-out pieces of the quantifiable electromagnetic relay according to the first embodiment of the present disclosure.

Referring to FIGS. 1 to 13, a quantifiable electromagnetic relay of the present disclosure is a two-set metering electromagnetic relay, which includes a housing 1, a PCB board 2, and leading-out pieces 3 that extend from an inside of the housing 1 to a first side out of the housing and are connected to a contact assembly inside the housing. There are four leading-out pieces 3, i.e., a leading-out piece 33, a leading-out piece 31, a leading-out piece 32, and a leading-out piece 34 arranged in order along the first side of the housing 1. The two leading-out pieces 31 and 32 in the middle are connected to one set of contact assembly inside the housing through one edge of the first side of the housing. The leading-out piece 33 of the two leading-out pieces on the two sides is connected to the other set of the contact assembly inside the housing through the other edge of the first side of the housing by going around a bottom of the housing close to the leading-out piece 34. Among the leading-out pieces 31 and 32, the leading-out piece 31 includes a plate-like sampling resistor piece 4 made of high resistivity materials and conductive pieces 6 connected at the two ends of the sampling resistor piece. Among the leading-out pieces 33 and 34, the leading-out piece 33 includes a plate-like sampling resistor piece 4 made of high resistivity materials and conductive pieces 6 connected at the two ends of the sampling resistor piece. A structure of the sampling resistor piece 4 of leading-out piece 33 (as shown in FIGS. 12 and 13) will be specifically described below, and the structure of the sampling resistor piece 4 of the leading-out piece 31 is the same as the structure of the sampling resistor piece 4 of the leading-out piece 33. It should be noted that leading-out piece 33 is an external leading-out piece, and leading-out piece 33 is connected to the inside of the housing through an internal leading-out piece 331. At the two ends of the sampling resistor piece 4, there are two sampling pins 41 extending in the same direction, for realizing inflow and outflow of current. The PCB board 2 is respectively connected to the sampling pins 41 at the two ends of the two sampling resistor pieces (i.e., the sampling resistor piece 4 of the leading-out piece 31 and the sampling resistor piece 4 of the leading-out piece 33) in an insertion welding. In the two sampling resistor pieces 4, a through-hole 42 is provided along a thickness direction of a PCB board, such that an induced current generated in an external alternating magnetic field by a first closed loop S1 formed by the through-hole 42 offsets an induced current generated by a second closed loop S2 formed by the sampling resistor piece 4, the sampling pins 41, and the PCB board 2 in the external alternating magnetic field, thereby enhancing the relay's ability to resist interference in measurement of the alternating magnetic field (as shown in FIG. 6), so as to enhance the relay's ability to resist interference in the measurement of an alternating magnetic field. According to a law of electromagnetic induction, $$E = -N\frac{d\Phi}{dt},$$

$\varphi = B*S$, where $\varphi$ is a magnetic flux through the closed loop, t is time, B is magnetic field strength, and S is an area perpendicular to a direction of the magnetic field. If the area of the first closed loop S1 formed by the through-hole 42 is set as an area of the second closed loop S2 formed by the sampling resistor piece 4, the sampling pins 41, and the PCB board 2, the external magnetic interference can be completely offset.

In this embodiment, the two sampling pins 41 in the same sampling resistor piece are respectively connected to a top surface inside the two ends of the corresponding sampling resistor piece 4.

Of course, the two sampling pins of the same sampling resistor piece may also be respectively connected to the top surface of the conductive pieces outside the two ends of the corresponding sampling resistor piece.

In this embodiment, the PCB board 2 is connected to the sampling pins 41 of the two sampling resistor pieces 4 on the same plane in an insertion welding manner.

In this embodiment, the housing 1 is further provided with coil leading-out pins 5 extending from an inside of the housing. The coil leading-out pins 5 and the sampling pins 41 of the two sampling resistor pieces 4 are respectively connected to the PCB board 2 on the same plane in an insertion welding manner.

In this embodiment, the sampling pins 41 of the two sampling resistor pieces 4 are designed in a pin structure.

In this embodiment, first projections 43 are further arranged in the sampling pins 41, at a connection with the corresponding leading-out pieces 4, and a cross-section of each of the first projections 43 is larger than a cross-section of each of the sampling pins 41, and the PCB board 2 is placed on a top surface of the first projections 43.

In this embodiment, a solder layer 44 is coated on an outside of a part of an upper surface of the sampling pins 41 corresponding to the first projections 43.

In this embodiment, the through-hole 42 of the sampling resistor piece 4 is on the vertical line at a midpoint of a connection line of the two sampling pins 41.

In this embodiment, the coil leading-out pins 5 are distributed on a top surface of the housing close to a second side of the housing, the second side of the housing is opposite to the first side of the housing 1. Two second projections 11 are respectively arranged at two sides of the top surface of the housing closed to the second side of the housing 1, and the top surface of the second projection 11 is at the same height as the top surface of the first projection 43. The PCB board 2 is placed on the top surface of the first projection 43 and on the top surface of the second projection 11.

In this embodiment, the sampling resistor piece 4 is made of a manganese-copper piece.

An electronic energy meter of the present disclosure includes the aforementioned two-set metering relay.

According to the quantifiable electromagnetic relay and electronic energy meter of the present disclosure, in one set of leading-out pieces, one of the leading-out pieces includes a plate-like sampling resistor piece 4 made of high resistivity materials, which is provided with two sampling pins 41 extending in the same direction for realizing the inflow and outflow of the current. The PCB board 2 is connected to the sampling pins 41 of the two sampling resistor pieces 4 in an insertion welding manner. In the two sampling resistor pieces 4, a through-hole 42 is arranged along a thickness direction of the board body of the sampling resistor piece, such that an induced current generated in an external alternating magnetic field by a first closed loop S1 formed by the through-hole 42 offsets an induced current generated by a second closed loop S2 formed by the sampling resistor pieces 4, the sampling pins 41, and the PCB board 2 in the external alternating magnetic field, thereby enhancing the relay's ability to resist interference in measurement of the alternating magnetic field. The two-set of sampling resistor pieces 4 are used as the sampling circuit for measurement, and the sampling pins 41 of the two sampling resistor pieces 4 in the same direction are directly connected and fixed to the PCB board 2 in an insertion welding manner, to avoid the drawbacks in the connection through signal wires in the existing technology, thereby having low manufacturing cost, easy installation, and highly automated level. The induced current generated in an external alternating magnetic field by the through-hole 42 of the sampling resistor piece 4 offsets an induced current generated by a second closed loop formed by the sampling resistor piece 4, the sampling pins 41, and the PCB board 2 in the external alternating magnetic field, thereby reducing the impact of alternating electromagnetic field interference on the measurement accuracy of manganese-copper and enhancing the relay's ability to resist interference in the measurement of the alternating magnetic field.

The Second Embodiment

Referring to FIGS. 14 to 18, a quantifiable electromagnetic relay and an electronic energy meter of the present disclosure has one difference from that in the first embodiment is in that electromagnetic relay is a one-set metering relay having two leading-out pieces. Among the two leading-out pieces 33 and 34, the leading-out piece 33 includes a plate-like sampling resistor piece 4 made of high resistivity materials. Another difference from the first embodiment is in that there is no second projection 11 on a top surface of the housing, instead, a third projection 12 is arranged at the coil leading-out pins 5. The PCB board 2 is placed on the top surface of the first projection 43 and on the top surface of the third projection 12.

Furthermore, a two-set metering relay for an electronic energy meter in the prior art generally includes a housing, a contact assembly inside the housing, and leading-out pieces connected to the corresponding contact assembly inside the housing. The two-set metering relay has four leading-out pieces, every two leading-out pieces form one set and are connected to the corresponding one set of the contact assembly. In the two sets of the leading-out pieces, one of the leading-out pieces in each set is provided with a metering device. In one set of the leading-out pieces, one of the leading-out pieces is provided with a manganese-copper piece as a sampling circuit for metering, while in the other set of the leading-out pieces, one of the leading-out pieces is provided with a current transformer as the sampling circuit for metering. The two sets of metering relays with such metering modes in the prior art have drawbacks below: first, the current transformer is used in one set for metering to increase the cost of the relay, thereby affecting the competitiveness of the product; second, the manganese-copper piece and the current transformer are connected with signal wires, and the coil leading-out pins are also connected with the signal wires, which leads to complex production processes. A number of the signal wires can increase the likelihood of welding errors, raise labor costs, and result in a low automation level.

The present disclosure also provides a two-set metering relay and an electronic energy meter thereof. Through structural improvement, embodiments of the two-set metering relay and electronic energy meter described herein can avoid the drawbacks caused by the connection with the signal wires, and have characteristics such as low manufacturing cost, easy installation, and a high automation level, and also can enhance the relay's ability to resist interference in the measurement of the alternating magnetic field.

The technical solution adopted by the present disclosure to address its technical problem is as follows: A two-set metering relay includes a housing, a PCB board, and four leading-out pieces extending from an inside of the housing to a first side of the housing and connected to contact assembly inside the housing, in which there are four leading-out pieces, every two of the leading-out pieces are connected to a corresponding one set of contact assembly; wherein in each set of the leading-out pieces, one of the leading-out pieces includes a sampling resistor piece made of high resistivity materials and conductive pieces connected at two ends of the sampling resistor piece, and two sampling pins extending in a same direction are provided at the two ends of the sampling resistor piece for realizing inflow and outflow of current; the PCB board is respectively connected to the sampling pins of the two leading-out pieces in an insertion welding manner.

In the two sampling resistor pieces, a through-hole is provided along a thickness direction of the board body of the sampling resistor piece, such that an induced current generated in an external alternating magnetic field by a first closed loop formed by the through-hole offsets an induced current generated by a second closed loop formed by the sampling resistor piece, the sampling pins, and the PCB board in the external alternating magnetic field, thereby enhancing the relay's ability to resist interference in measurement of the alternating magnetic field.

The PCB board is connected to the sampling pins of the two leading-out pieces on the same plane in an insertion welding manner.

The housing is further provided with coil leading-out pins extending from the inside of the housing, and the coil leading-out pins and the sampling pins of the two leading-out pieces are respectively connected with the PCB board on the same plane in an insertion welding manner.

The two sampling pins in the same leading-out piece are respectively connected to top surfaces inside the two ends of the corresponding sampling resistor piece.

The two sampling pins in the same leading-out piece are respectively connected to top surfaces of the corresponding conductive pieces.

The sampling pins are respectively designed in a pin structure.

A first projection is further arranged at a connection with the corresponding leading-out piece in the sampling pin, and a cross-section of the first projection is larger than a cross-section of the sampling pin, and the PCB board is placed on a top surface of the first projection.

A solder layer is coated on an outside of a part of an upper surface of the sampling pin corresponding to the first projection.

The through-hole of the sampling resistor piece is on a vertical line at a midpoint of a connection line of the two sampling pins.

The through-hole of the sampling resistor piece is at a center of the sampling resistor piece.

The coil leading-out pins are distributed on a top surface of the housing close to a second side of the housing, the second side of the housing is opposite to the first side of the housing, and second projection are respectively arranged at two sides of the top surface of the housing, the second projections close to the second side of the housing, and the top surface of the second projection is at a same height as the top surface of the first projection; the PCB board is placed on the top surface of the first projection and on the top surface of the second projection.

The four leading-out pieces are arranged in order along the first side of the housing, in which the two leading-out pieces in the middle are respectively connected to one set of contact assembly inside the housing through one edge of the first side of the housing, and one of the two leading-out pieces on the two sides is connected to the other set of the contact assembly inside the housing from the other edge of the first side of the housing by going around the bottom of the housing to close to the other one of the leading-out pieces.

The sampling resistor pieces mentioned are made of manganin or constantan.

An electronic energy meter includes the above mentioned two-set metering relay.

Compared to the prior art, the present disclosure has beneficial effects as follows:

the present disclosure includes, in each set of the leading-out pieces, one of the leading-out pieces includes a plate-like sampling resistor made of high resistivity materials, and the sampling resistor has two sampling pins extending in the same direction for realizing the inflow and outflow of the current. The PCB board is connected to the sampling pins of the two leading-out pieces in an insertion soldering manner. By using the two sets of sampling resistor pieces as the sampling circuit for measurement, and the sampling pins of the two sampling resistor pieces in the same direction are directly connected to the PCB board in an insertion soldering manner. This can avoid the drawbacks caused by the connection with the signal wires in the prior art, and have characteristics such as low manufacturing cost, ease of installation, and a high automation level.

Furthermore, in the two sampling resistor pieces, a through-hole is provided along a thickness direction of the board body of the sampling resistor piece, such that an induced current generated in an external alternating magnetic field by a first closed loop formed by the through-hole offsets an induced current generated by a second closed loop formed by the sampling resistor piece, the sampling pins, and the PCB board in the external alternating magnetic field, thereby enhancing the relay's ability to resist interference in measurement of the alternating magnetic field. According to the present disclosure, the induced current generated in the external alternating magnetic field by the through-hole of the sampling resistor piece offsets an induced current generated in the external alternating magnetic field by the second closed loop formed by the sampling resistor piece, the sampling pins, and the PCB board, thereby reducing the impact of alternating electromagnetic field interference on the measurement accuracy of manganese-copper and enhancing the relay's ability to resist interference in the measurement of the alternating magnetic field.

The present disclosure is further explained in detail in conjunction with the drawings and the embodiments; however, the two-set metering relay and its electronic energy meter of the present disclosure are not limited to the embodiments.

The Third Embodiment

Referring to FIGS. 19 to 30, a two-set metering electromagnetic relay of the present disclosure includes a housing 1, a PCB board 2, and leading-out pieces 3 that extend from an inside of the housing 1 to a first side out of the housing and are connected to contact assembly inside the housing. There are four leading-out pieces 3, i.e., a leading-out piece 33, a leading-out piece 31, a leading-out piece 32, and a leading-out piece 34 arranged in order along the first side of the housing 1. The two leading-out pieces 31 and 32 in the middle are connected to one set of contact assembly inside the housing through one edge of the first side of the housing. The leading-out piece 33 of the two leading-out pieces on the two sides is connected to the other set of the contact assembly inside the housing through the other edge of first side of the housing by going around a bottom of the housing close to the leading-out piece 34. Among the leading-out pieces 31 and 32, the leading-out piece 31 includes a plate-like sampling resistor piece 4 made of high resistivity materials and conductive pieces 6 connected at the two ends of the sampling resistor piece. Among the leading-out pieces 33 and 34, the leading-out piece 33 includes a plate-like sampling resistor piece 4 made of high resistivity materials and conductive pieces 6 connected at the two ends of the sampling resistor piece. A structure of the sampling resistor piece 4 of leading-out piece 33 (as shown in FIGS. 11 and 12) will be specifically described below, and the structure of the sampling resistor piece 4 of the leading-out piece 31 is the same as the structure of the sampling resistor piece 4 of the leading-out piece 33. It should be noted that leading-out piece 33 is an external leading-out piece, and leading-out piece 33 is connected to the inside of the housing through an internal leading-out piece 331. At the two ends of the sampling resistor piece 4, there are two sampling pins 41 extending in the same direction, for realizing inflow and outflow of current. The PCB board 2 is respectively connected to the sampling pins 41 at the two ends of the two sampling resistor pieces (i.e., the sampling resistor piece 4 of the leading-out piece 31 and the sampling resistor piece 4 of the leading-out piece 33) in an insertion welding.

In this embodiment, the two sampling pins 41 in the same sampling resistor piece are respectively connected to a top surface inside the two ends of the corresponding sampling resistor piece 4.

Of course, the two sampling pins of the same sampling resistor piece may also be respectively connected to the top surface of the conductive pieces at the two ends of the corresponding sampling resistor piece.

In this embodiment, the PCB board 2 is connected to the sampling pins 41 of the two sampling resistor pieces 4 on the same plane in an insertion welding manner.

In this embodiment, the housing 1 is further provided with coil leading-out pins 5 extending from an inside of the housing. The coil leading-out pins 5 and the sampling pins 41 of the two sampling resistor pieces 4 are respectively connected to the PCB board 2 on the same plane in an insertion welding manner.

In this embodiment, the sampling pins 41 of the two sampling resistor pieces 4 are designed in a pin structure.

In this embodiment, first projections 43 are further arranged in the sampling pins 41, at a connection with the corresponding leading-out pieces 4, and a cross-section of each of the first projections 43 is larger than a cross-section of each of the sampling pins 41, and the PCB board 2 is placed on a top surface of the first projections 43.

In this embodiment, a solder layer 44 is coated on an outside of a part of an upper surface of the sampling pins 41 corresponding to the first projections 43.

In this embodiment, the through-hole 42 of the sampling resistor piece 4 is on the vertical line at a midpoint of a connection line of the two sampling pins 41.

In this embodiment, the coil leading-out pins 5 are distributed on a top surface of the housing close to a second side of the housing, the second side of the housing is opposite to the first side of the housing 1. Two second projections 11 are respectively arranged at two sides of the top surface of the housing closed to the second side of the housing 1, and the top surface of the second projection 11 is at the same height as the top surface of the first projection 43. The PCB board 2 is placed on the top surface of the first projection 43 and on the top surface of the second projection 11.

In this embodiment, the sampling resistor piece 4 is made of a manganese-copper piece, and the conductive piece 6 is a phosphor bronze piece.

An electronic energy meter of the present disclosure includes the aforementioned two-set metering relay.

According to the two-set metering relay and the electronic energy meter of the present disclosure, in one set of leading-out pieces, one of the leading-out pieces includes a plate-like sampling resistor piece 4 made of high resistivity materials, which is provided with two sampling pins 41 extending in the same direction for realizing the inflow and outflow of the current. The PCB board 2 is connected to the sampling pins 41 of the two leading-out pieces in an insertion welding manner. The two-set of sampling resistor pieces are used as the sampling circuit for measurement, and the sampling pins of the two sampling resistor pieces in the same direction are directly connected and fixed to the PCB board in an insertion welding manner, to avoid the drawbacks in the connection through signal wires in the existing technology, thereby having low manufacturing cost, easy installation, and highly automated level.

The Fourth Embodiment

Figure 14:
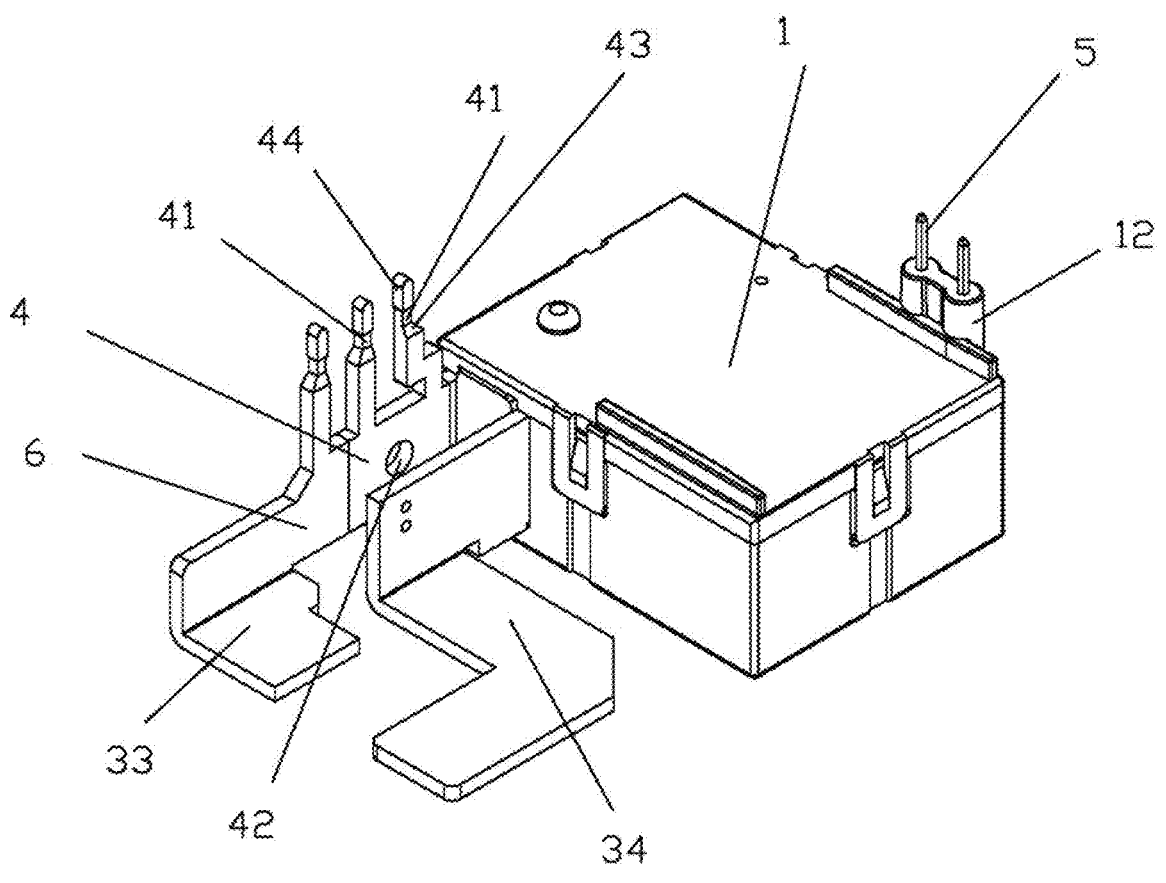
FIG. 14 is a perspective view of a quantifiable electromagnetic relay without the PCB board according to a second embodiment of the present disclosure.
Figure 15:
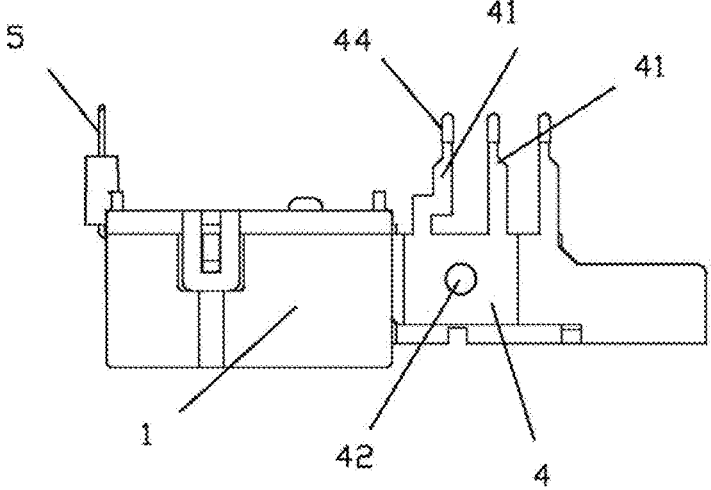
FIG. 15 is a front view of the quantifiable electromagnetic relay without a PCB board according to the second embodiment of the present disclosure.
Figure 16:
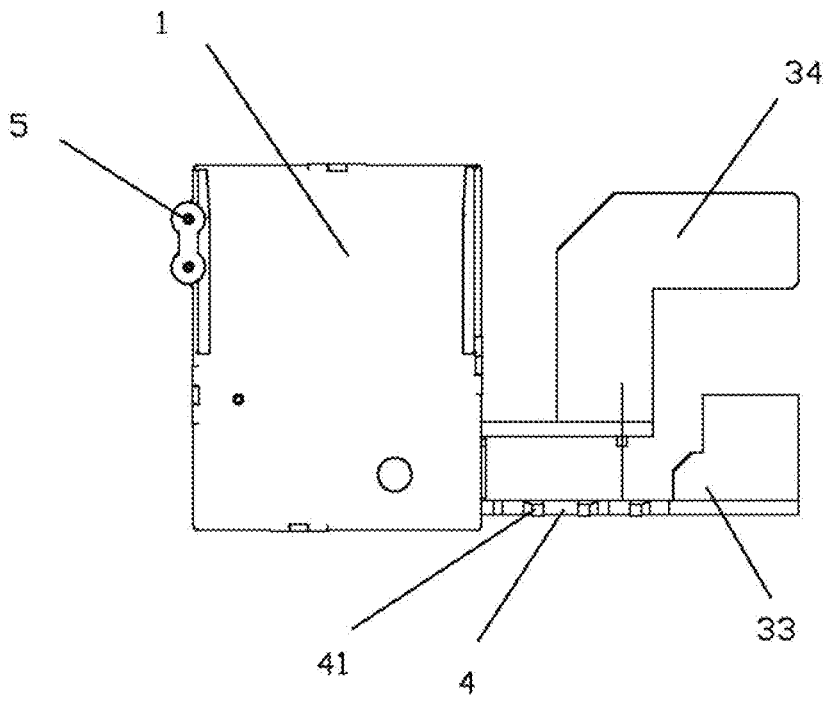
FIG. 16 is a top view of the quantifiable electromagnetic relay without the PCB board according to the second embodiment of the present disclosure.
Figure 17:
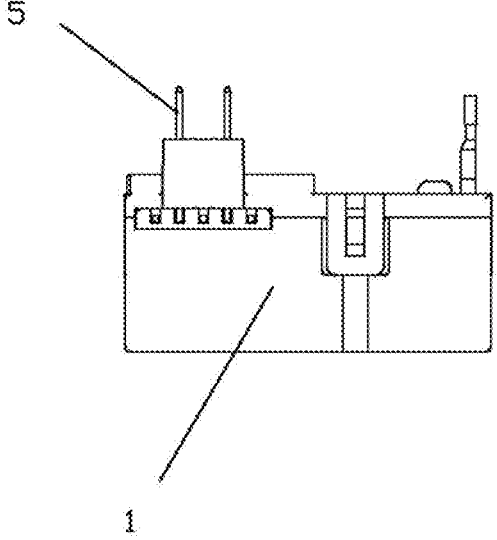
FIG. 17 is a back view of the quantifiable electromagnetic relay without the PCB board according to the second embodiment of the present disclosure.
Figure 18:
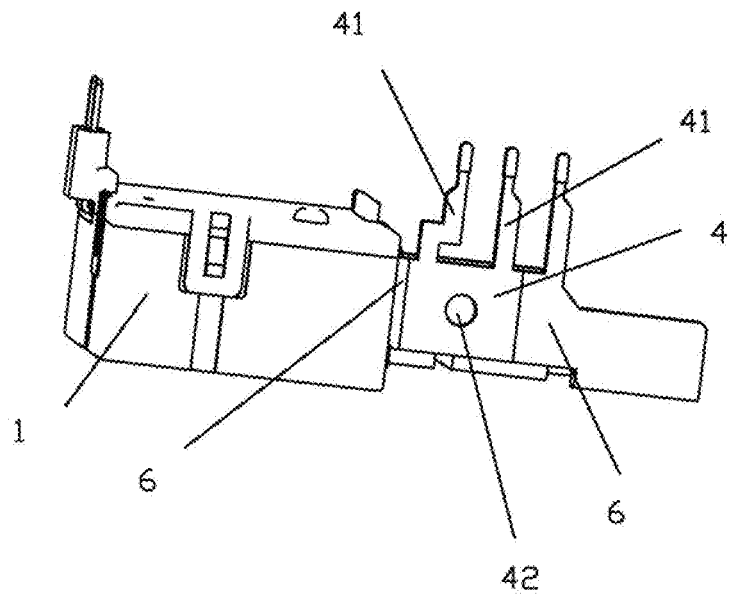
FIG. 18 is a perspective view of the quantifiable electromagnetic relay without the PCB board and rotated by one angle according to the second embodiment of the present disclosure.
Figure 19:
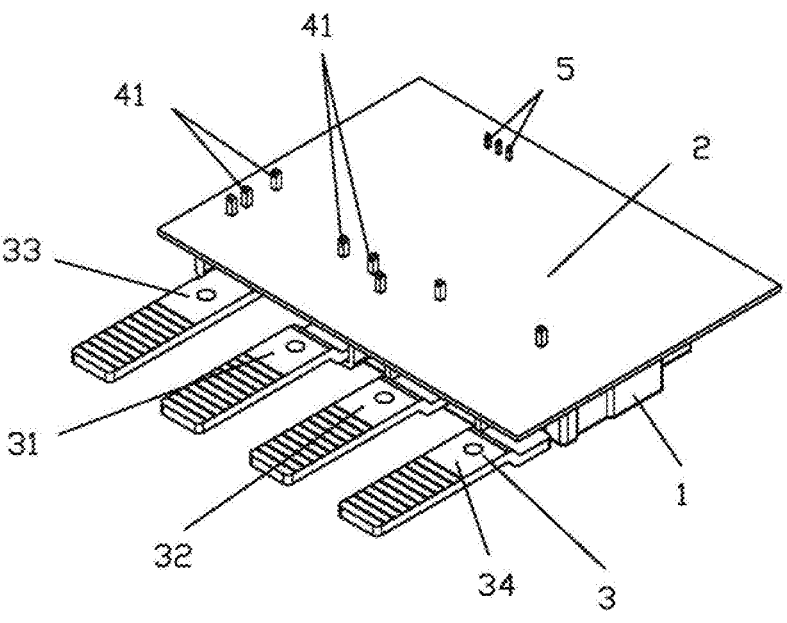
FIG. 19 is a perspective view of a two-set metering relay according to a third embodiment of the present disclosure.
Figure 20:
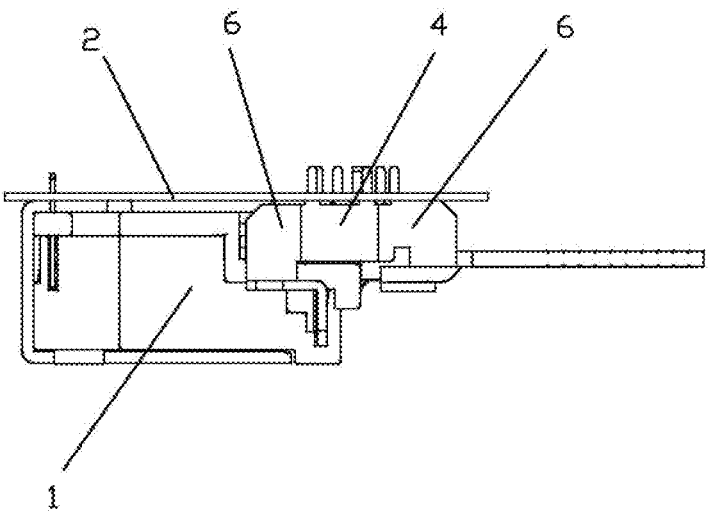
FIG. 20 is a front view of the two-set metering relay according to the third embodiment of the present disclosure.
Figure 21:
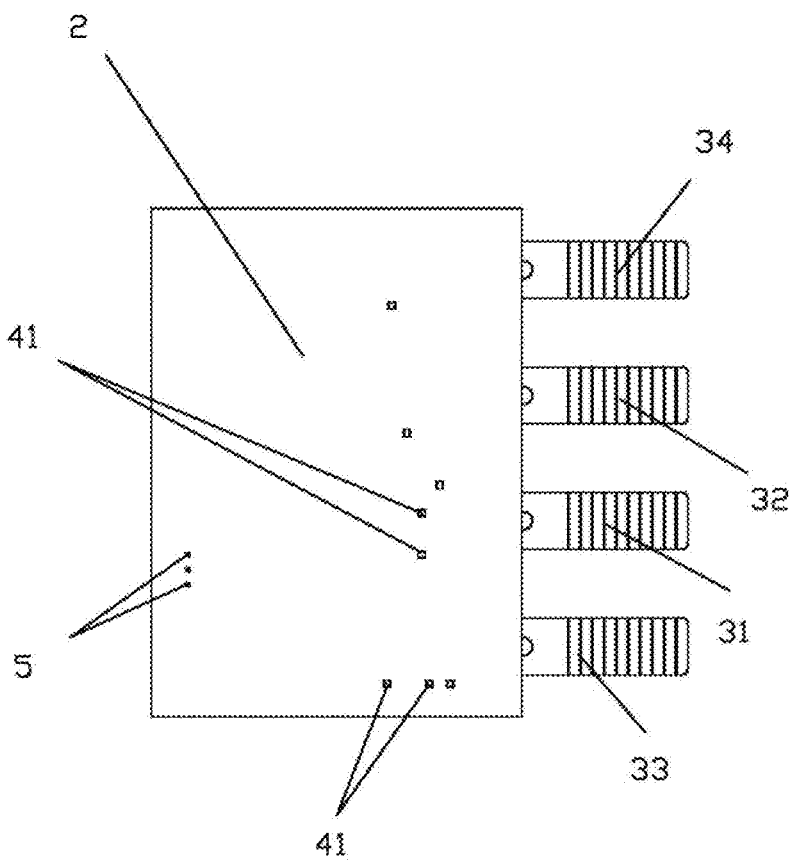
FIG. 21 is a top view of the two-set metering relay according to the third embodiment of the present disclosure.
Figure 22:
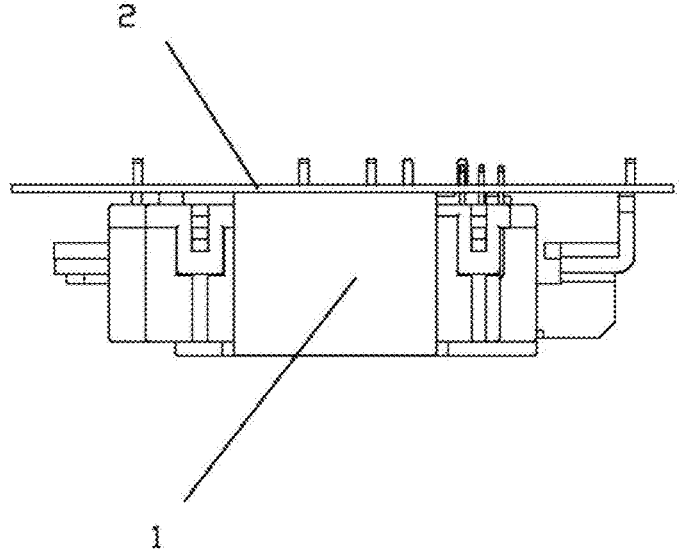
FIG. 22 is a left view of the two-set metering relay according to the third embodiment of the present disclosure.
Figure 23:
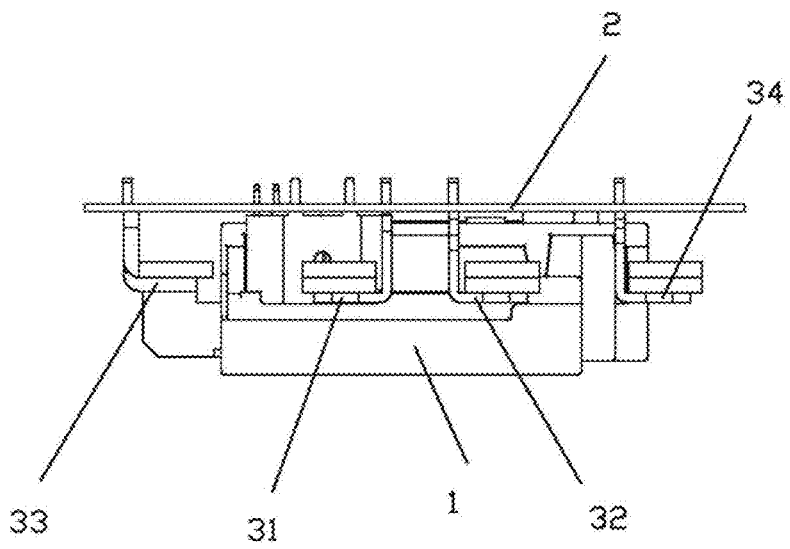
FIG. 23 is a right view of the two-set metering relay according to the third embodiment of the present disclosure.
Figure 24:
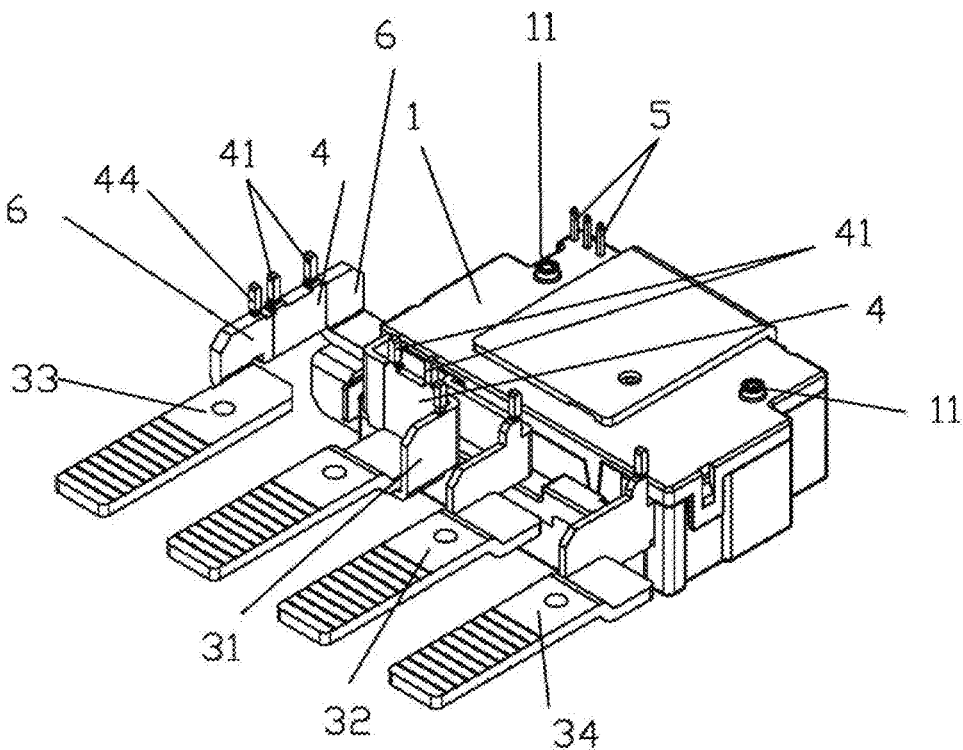
FIG. 24 is a perspective view of the two-set metering relay without a PCB board according to the third embodiment of the present disclosure.
Figure 25:
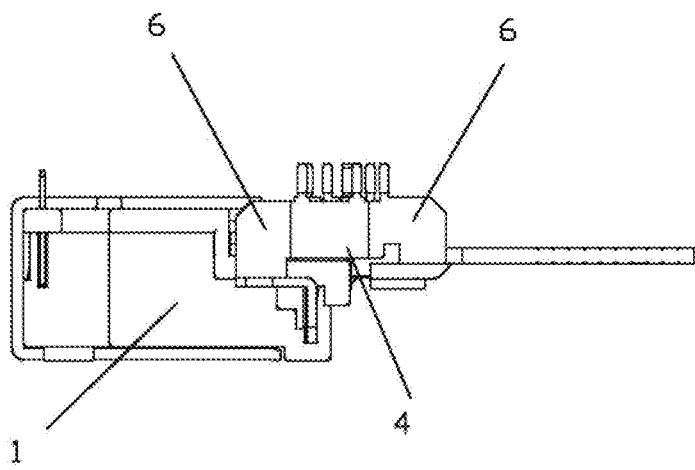
FIG. 25 is a front view of the two-set metering relay without the PCB board according to the third embodiment of the present disclosure.
Figure 26:
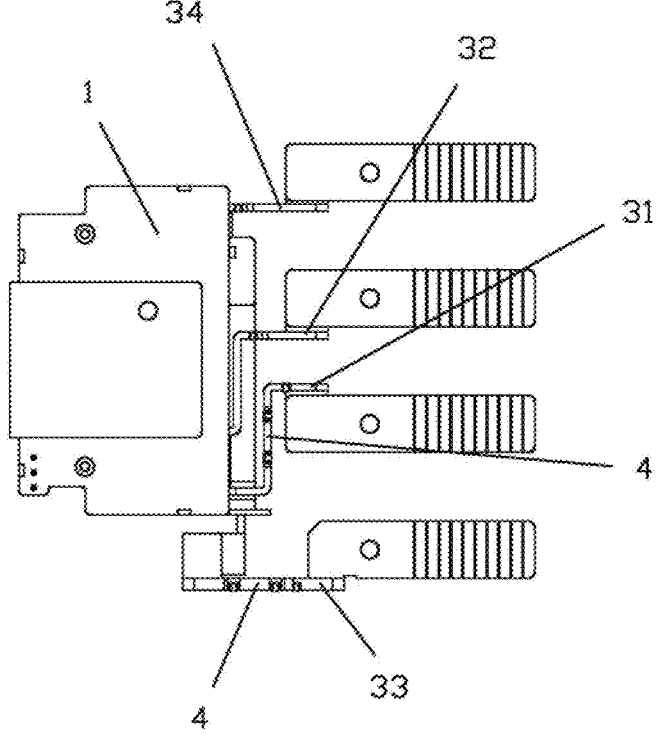
FIG. 26 is a top view of the two-set metering relay without the PCB board according to the third embodiment of the present disclosure.
Figure 27:
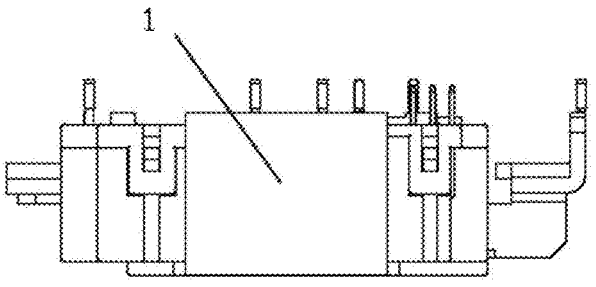
FIG. 27 is a left view of the two-set metering relay without the PCB board according to the third embodiment of the present disclosure.
Figure 28:
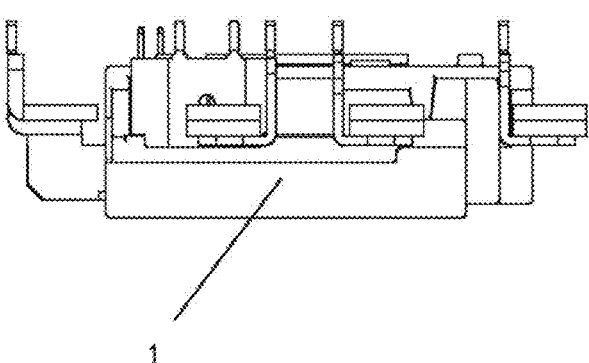
FIG. 28 is a right view of the two-set metering relay without the PCB board according to the third embodiment of the present disclosure.
Figure 29:
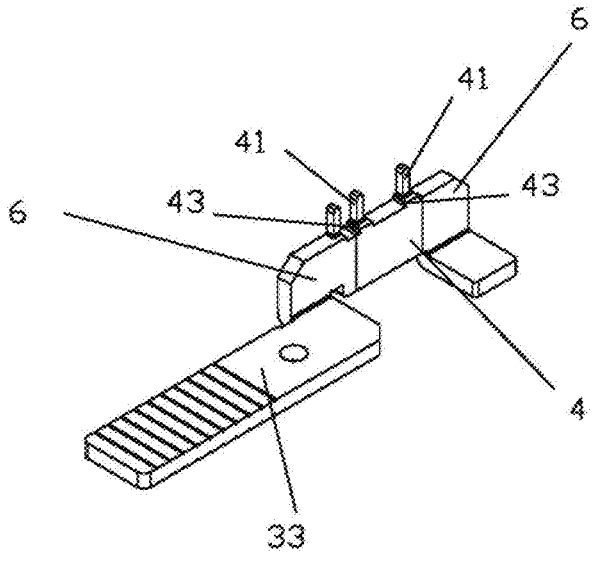
FIG. 29 is a perspective view of one of leading-out pieces of the two-set metering relay according to the third embodiment of the present disclosure.
Figure 30:
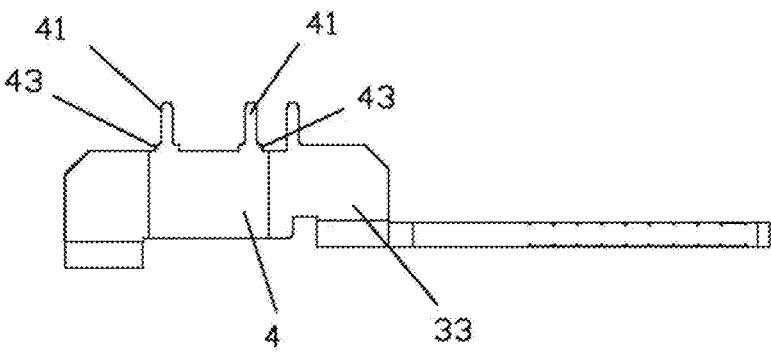
FIG. 30 is a front view of one of the leading-out pieces a of the two-set metering relay according to the third embodiment of the present disclosure.
Figure 31:
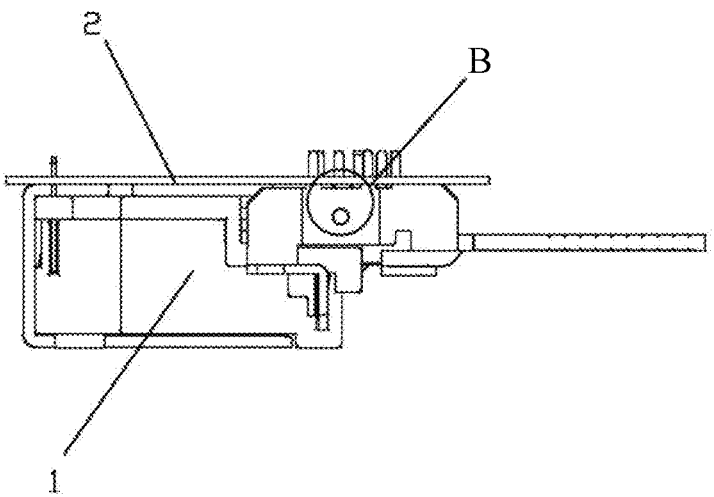
FIG. 31 is a front view of a two-set metering relay according to a fourth embodiment of the present disclosure.
Figure 32:
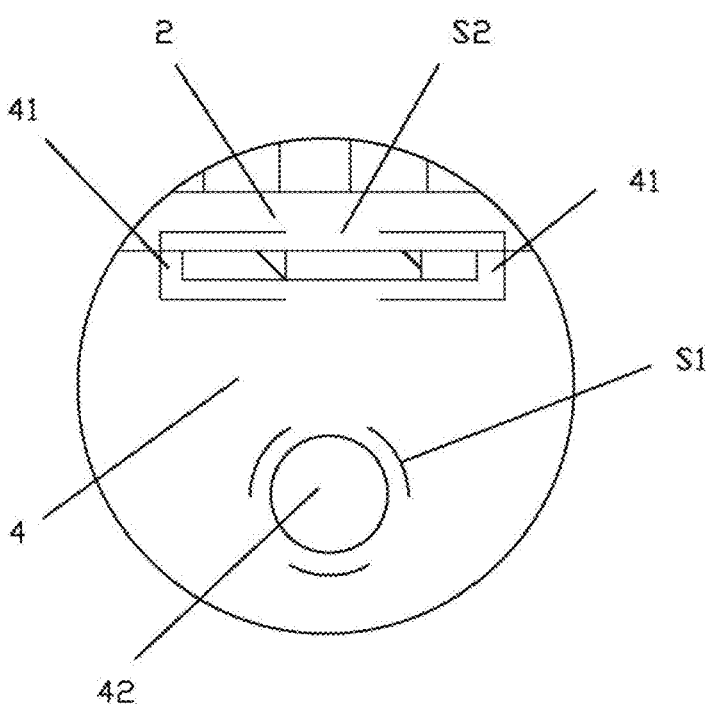
FIG. 32 is an enlarged schematic view of part B in FIG. 31.
Figure 33:
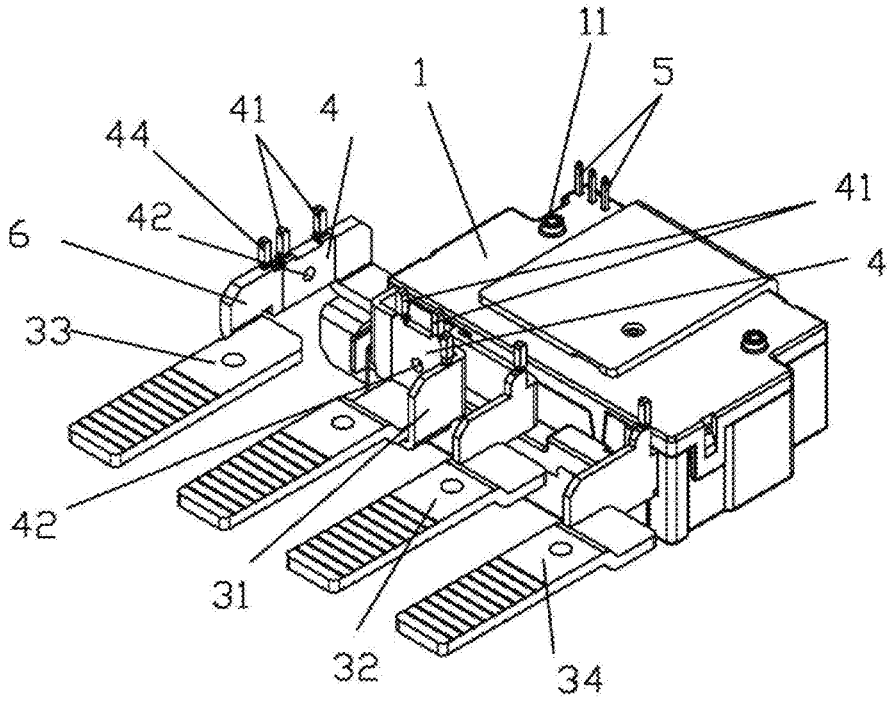
FIG. 33 is a perspective view of the two-set metering relay without the PCB board according to the fourth embodiment of the present disclosure.
Figure 34:
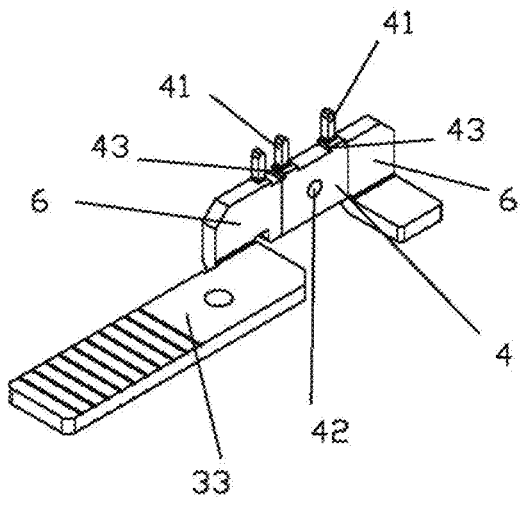
FIG. 34 is a perspective view of one of the leading-out pieces of the two-set metering relay according to the fourth embodiment of the present disclosure.
Figure 35:
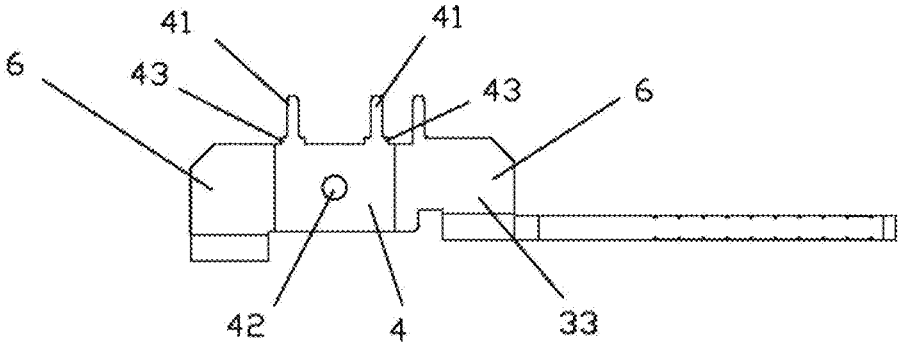
FIG. 35 is a front view of one of the leading-out pieces according to the fourth embodiment of the present disclosure.

As shown in FIGS. 31-35, a two-set metering relay and its electronic energy meter of the present disclosure has difference from that of the third embodiment in that in the sampling resistor piece 4 of the leading-out piece 31 and the sampling resistor piece 4 of the leading-out piece 33, a through-hole 42 is provided along a thickness direction of a PCB board, such that an induced current generated in an external alternating magnetic field by a first closed loop S1 formed by the through-hole 42 offsets an induced current generated by a second closed loop S2 formed by the sampling resistor piece 4, the sampling pins 41, and the PCB board 2 in the external alternating magnetic field, thereby enhancing the relay's ability to resist interference in measurement of the alternating magnetic field (as shown in FIG. 14), so as to enhance the relay's ability to resist interference in the measurement of an alternating magnetic field. According to a law of electromagnetic induction, $$E = -N\frac{d\Phi}{dt},$$

φ=B*S, where φ is a magnetic flux through the closed loop, t is time, B is magnetic field strength, and S is an area perpendicular to a direction of the magnetic field. If the area of the first closed loop S1 formed by the through-hole 42 is set as an area of the second closed loop S2 formed by the sampling resistor piece 4, the sampling pins 41, and the PCB board 2, the external magnetic interference can be completely offset.

According to the two-set metering relay and its electronic energy meter of the present disclosure, in the two sampling resistor pieces 4, a through-hole 42 is provided along a thickness direction of the board body of the sampling resistor piece, such that an induced current generated in an external alternating magnetic field by a first closed loop formed by the through-hole 42 offsets an induced current generated by a second closed loop S2 formed by the sampling resistor piece 4, the sampling pins 41, and the PCB board 2 in the external alternating magnetic field, thereby enhancing the relay's ability to resist interference in measurement of the alternating magnetic field. According to the present disclosure, the induced current generated in the external alternating magnetic field by the through-hole 42 of the sampling resistor piece offsets an induced current generated in the external alternating magnetic field by the second closed loop formed by the sampling resistor piece 4, the sampling pins 41, and the PCB board 2, thereby reducing the impact of alternating electromagnetic field interference on the measurement accuracy of manganese-copper and enhancing the relay's ability to resist interference in the measurement of the alternating magnetic field.

It should be understood that the application of the present disclosure is not limit to the detailed structure and arrangement of components provided in this specification. The present disclosure can have other embodiments, and can be implemented and carried out in various ways. The aforementioned variations and modifications fall within the scope of the present disclosure. It should be understood that the disclosure disclosed and defined in this specification may extend to all alternative combinations of two or more individual features that are apparent or mentioned in the text and/or drawings. It should be understood that the disclosure disclosed and defined in this specification may extend to all alternative combinations of the embodiments described herein. All of the different combinations form various alternative aspects of the present disclosure. Embodiments described in this specification illustrate the best modes known for carrying out the present disclosure, and will allow those skilled in the art to utilize the present disclosure.

What is claimed is:

1. A quantifiable electromagnetic relay, comprising:

a housing;

two leading-out pieces extending from an inside of the housing to a first side out of the housing and connected to a contact assembly inside the housing; one of the two leading-out pieces comprises a sampling resistor piece which is plate-like and made of high resistivity materials and conductive pieces respectively connected at two ends of the sampling resistor piece, two sampling pins extending in the same direction being arranged at the two ends of the sampling resistor piece on the leading-out pieces, for realizing inflow and outflow of current; and a PCB board respectively connected to the two sampling pins in an insertion welding manner, wherein a through-hole is provided in the sampling resistor piece along a thickness direction of a board body of the sampling resistor piece, such that an induced current generated in an external alternating magnetic field by a first closed loop formed by the through-hole offsets an induced current generated by a second closed loop formed by the sampling resistor piece, the sampling pins, and the PCB board in the external alternating magnetic field, thereby enhancing an ability of the relay to resist interference in measurement of the external alternating magnetic field wherein the first closed loop and the second closed loop are on the same plane.

2. The quantifiable electromagnetic relay according to claim 1, wherein an area of the first closed loop is the same as an area of the second closed loop, and the induced current generated by the first closed loop in the external alternating magnetic field completely offsets the induced current generated by the second closed loop in the external alternating magnetic field.

3. The quantifiable electromagnetic relay according to claim 1, wherein there are two leading-out pieces extending from the inside of the housing to the first side out of the housing and connected to the contact assembly inside the housing, and there is one set of contact assembly inside the housing; one of the two leading-out pieces comprises the sampling resistor piece.

4. The quantifiable electromagnetic relay according to claim 1, wherein there are four leading-out pieces extending from the inside of the housing to the first side of the housing and connected to the contact assembly inside the housing are four, and there are two sets of contact assemblies inside the housing; in the four leading-out pieces, every two of the four leading-out pieces are connected to one set of corresponding contact assembly; in each set of the leading-out pieces, one of the leading-out pieces comprises the sampling resistor piece.

5. The quantifiable electromagnetic relay according to claim 1, wherein the PCB board is connected to the sampling pins on the same plane in an insertion welding manner.

6. The quantifiable electromagnetic relay according to claim 5, wherein the housing is further provided with coil leading-out pins extending from the inside of the housing, and the coil leading-out pins and the sampling pins are respectively connected to the PCB board on the same plane in the insertion welding manner.

7. The quantifiable electromagnetic relay according to claim 5, wherein the two sampling pins in a same leading-out piece are respectively connected to top surfaces of corresponding sampling resistor pieces.

8. The quantifiable electromagnetic relay according to claim 5, wherein the two sampling pins in a same leading-out piece are respectively connected to a top surface of corresponding conductive pieces.

9. The quantifiable electromagnetic relay according to claim 7, wherein the sampling pins are in a pin structure.

10. The quantifiable electromagnetic relay according to claim 6, wherein first projections are further arranged in the sampling pins, at a connection with corresponding leading-out pieces, and a cross-section of each of the first projections is larger than a cross-section of each of the two sampling pins, and the PCB board is placed on a top surface of the first projections.

11. The quantifiable electromagnetic relay according to claim 10, wherein a solder layer is coated on an outside of a part of an upper surface of the sampling pins corresponding to the first projections.

12. The quantifiable electromagnetic relay according to claim 1, wherein the through-hole of the sampling resistor piece is on a vertical line at a midpoint of a connection line of the two sampling pins.

13. The quantifiable electromagnetic relay according to claim 10, wherein the coil leading-out pins are distributed on a top surface of the housing close to a second side of the housing, the second side of the housing is opposite to the first side of the housing, and second projections are arranged at two sides of the top surface of the housing, the second projections close to the second side of the housing, and a top surface of the second projection is at a same height as a top surface of the first projection; the PCB board is placed on the top surface of the first projections and the top surface of the second projections.

14. The quantifiable electromagnetic relay according to claim 3, wherein there are four leading-out pieces arranged in order along the first side of the housing, in which two leading-out pieces in the middle of the four leading-out pieces are respectively connected to one set of the contact assembly inside the housing through one edge of the first side of the housing, and one of the two leading-out pieces on the two sides is connected to another set of the contact assembly inside the housing from another edge of the first side of the housing by going around a bottom of the housing to close to the other one of the leading-out pieces.

15. The quantifiable electromagnetic relay according to claim 1, wherein the sampling resistor piece is made of a manganese-copper piece or a constantan piece.

16. An electronic energy meter, comprising the quantifiable electromagnetic relay according to claims 1.

17. A two-set metering relay, comprising:

a housing, a PCB board, and four leading-out pieces extending from an inside of the housing to a first side out of the housing and connected to a contact assembly inside the housing, wherein every two of the four leading-out pieces are connected to one set of a corresponding contact assembly, wherein in each set of the leading-out pieces, one of the leading-out pieces comprises a sampling resistor piece made of high resistivity materials and two conductive pieces connected at two ends of the sampling resistor piece, and two sampling pins extending in a same direction are provided at the two ends of the sampling resistor piece for realizing inflow and outflow of current; the PCB board is respectively connected to the sampling pins of the two leading-out pieces in an insertion welding manner.

18. The two-set metering relay according to claim 17, wherein a through-hole is provided in each sampling resistor piece of the two sampling resistor pieces along a thickness direction of a board body of the sampling resistor piece, such that an induced current generated in an external alternating magnetic field by a first closed loop formed by the through-hole offsets an induced current generated by a second closed loop formed by the sampling resistor piece, the sampling pins, and the PCB board in the external alternating magnetic field, thereby enhancing an ability of the relay to resist interference in measurement of the external alternating magnetic field.

19. The two-set metering relay according to claim 17, wherein the PCB board is connected to the sampling pins of the two leading-out pieces on the same plane in an insertion welding manner.

20. The two-set metering relay according to claim 19, wherein the housing is further provided with coil leading-out pins extending from the inside of the housing, and the coil leading-out pins and the sampling pins of the two leading-out pieces are respectively connected with the PCB board on the same plane in the insertion welding manner.

21. The two-set metering relay according to claim 19, wherein the two sampling pins in a same leading-out piece are respectively connected to a top surface inside the two ends of a corresponding sampling resistor piece.

22. The two-set metering relay according to claim 19, wherein the two sampling pins in the same leading-out piece are respectively connected to top surfaces of the conductive pieces outside the two ends of the corresponding sampling resistor piece.

23. The two-set metering relay according to claim 21, wherein the sampling pins of the two leading-out pieces are respectively in a pin structure.

24. The two-set metering relay according to claim 20, wherein a first projection is further arranged at a connection with the corresponding leading-out piece in the sampling pin, and a cross-section of the first projection is larger than a cross-section of the sampling pin, the PCB board is placed on a top surface of the first projection.

25. The two-set metering relay according to claim 24, wherein a solder layer is coated on an outside of a part of an upper surface of the sampling pin corresponding to the first projection.

26. The two-set metering relay according to claim 18, wherein the through-hole of the sampling resistor piece is on a vertical line at a midpoint of a connection line of the two sampling pins.

27. The two-set metering relay according to claim 26, wherein the through-hole of the sampling resistor piece is at a center of the sampling resistor piece.

28. The two-set metering relay according to claim 24, wherein the coil leading-out pins are distributed on a top surface of the housing close to a second side of the housing, the second side of the housing is opposite to the first side of the housing, and second projections are respectively arranged at two sides of the top surface of the housing, the second projections close to the second side of the housing, and the top surface of the second projection is at a same height as the top surface of the first projection; the PCB board is placed on the top surface of the first projection and the top surface of the second projection.

29. The two-set metering relay according to claim 17, wherein the four leading-out pieces are arranged in order along the first side of the housing, in which two leading-out pieces in the middle of the four leading-out pieces are respectively connected to one set of contact assembly inside the housing through one edge of the first side of the housing, and one of the two leading-out pieces on two sides is connected to another set of the contact assembly inside the housing from another edge of the first side of the housing by going around a bottom of the housing to close to the other one of the leading-out pieces.

30. An electronic energy meter, comprising the two-set metering relay according to claim 17.

* * * * *